United States Patent [19]

Nakai et al.

[11] Patent Number: 4,831,592
[45] Date of Patent: May 16, 1989

[54] NONVOLATILE SEMICONDUCTOR MEMORY DEVICE

[75] Inventors: Hiroto Nakai, Kawasaki; Hiroshi Iwahashi, Yokohama; Masamichi Asano, Tokyo; Isao Sato, Yokohama; Shigeru Kumagai, Tokyo; Kazuto Suzuki, Niigata, all of Japan

[73] Assignee: Kabushiki Kaisha Toshiba, Kawasaki, Japan

[21] Appl. No.: 68,521

[22] Filed: Jul. 1, 1987

[30] Foreign Application Priority Data

Jul. 9, 1986 [JP] Japan ................................ 61-159742
Jul. 9, 1986 [JP] Japan ................................ 61-159744

[51] Int. Cl.$^4$ ............................................. G11C 7/00
[52] U.S. Cl. ................................. 365/189.09; 365/222
[58] Field of Search ................ 365/226, 189, 230, 228

[56] References Cited

U.S. PATENT DOCUMENTS

| | | | |
|---|---|---|---|
| 4,263,664 | 4/1981 | Owen et al. | 365/230 X |
| 4,393,481 | 7/1983 | Owen et al. | 265/228 |
| 4,506,350 | 3/1985 | Asano et al. | 365/191 |

Primary Examiner—Joseph A. Popek
Attorney, Agent, or Firm—Finnegan, Henderson, Farabow, Garrett & Dunner

[57] ABSTRACT

A nonvolatile semiconductor memory device includes a pulse signal generator for applying a pulse signal to a capacitor, a first diode connected at an anode to the capacitor, a charging circuit for charging the capacitor in a programming mode, a voltage limiter for preventing a potential at the output node from increasing above a predetermined level, memory cells of nonvolatile MOS transistors, a load MOS transistor connected to a high-voltage terminal, a row decoder for selecting a set of memory cells arranged in one row, column gate MOS transistors connected between respective sets of memory cells arranged in one column and the load MOS transistor, a data generator responsive to the voltage at the output node to turn on or off the load MOS transistor, and a column decoder responsive to the voltage at the output node to selectively energize the column gate MOS transistors. It further comprises a second diode connected between the cathode of the first diode and the output node, and a discharging circuit for discharging the cathode of the first diode to a reference voltage level during a time other than a programming mode.

18 Claims, 6 Drawing Sheets

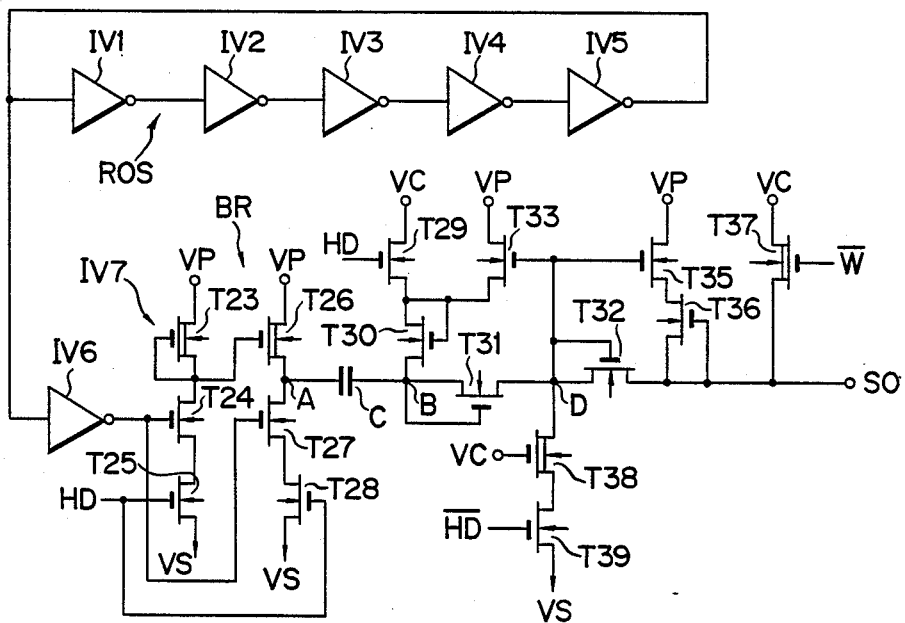
F I G. 3

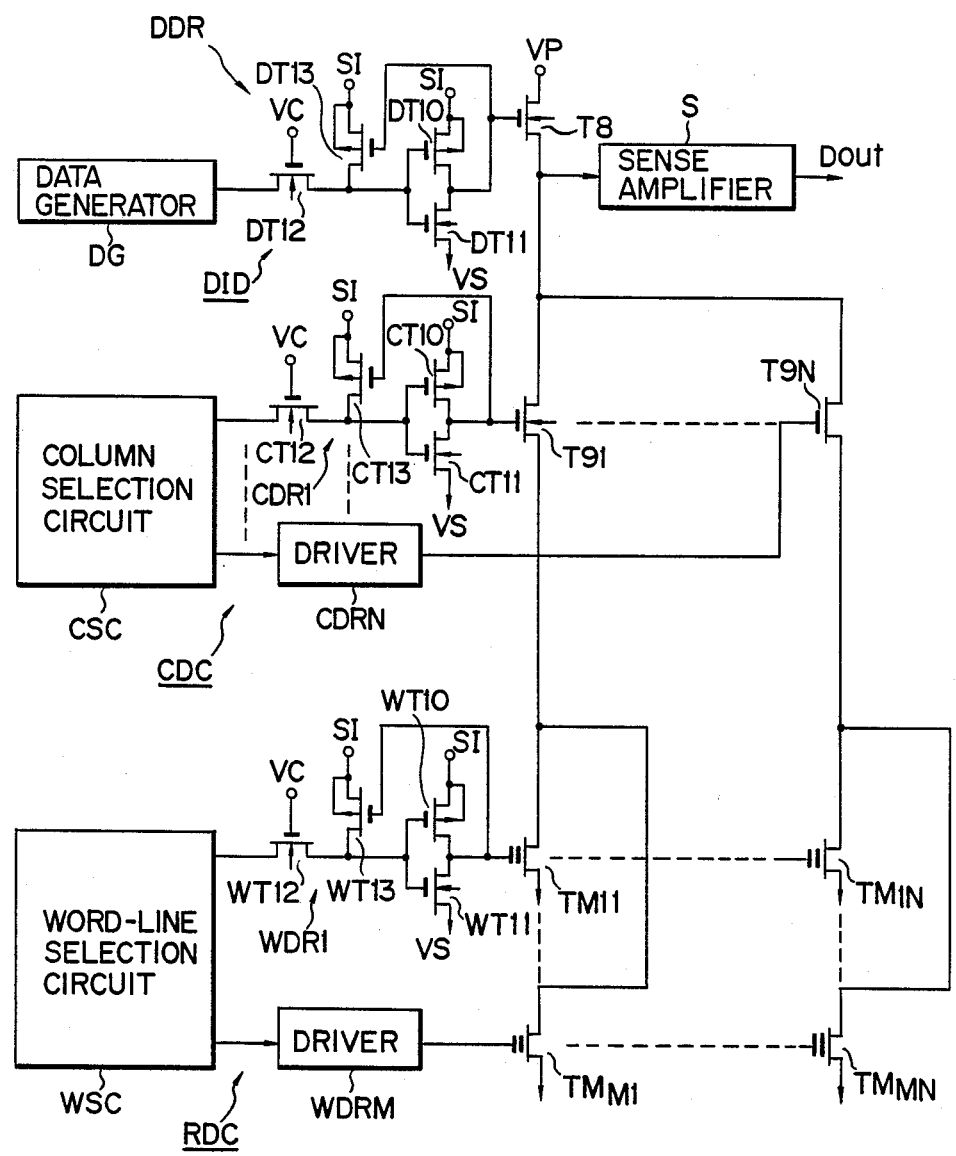
F I G. 4

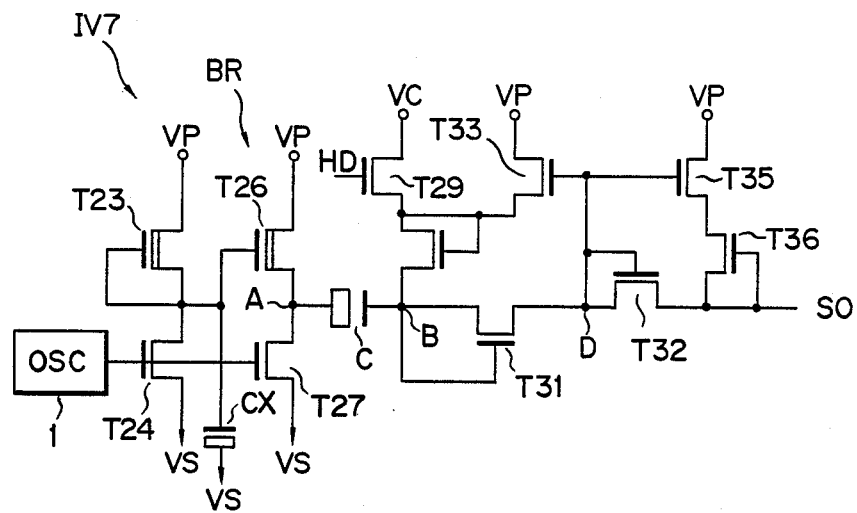
F I G. 8
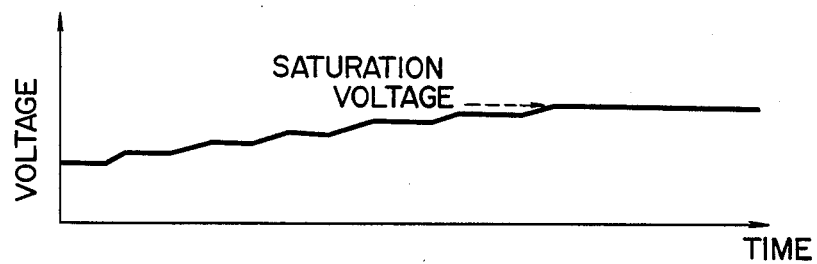
F I G. 9

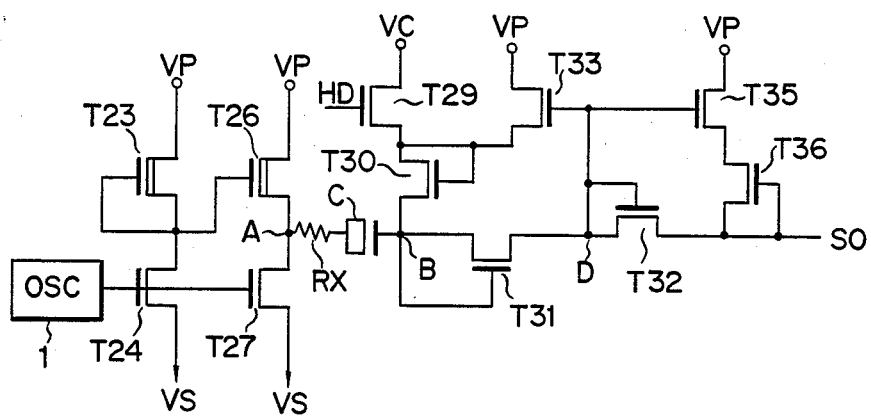
F I G. 10
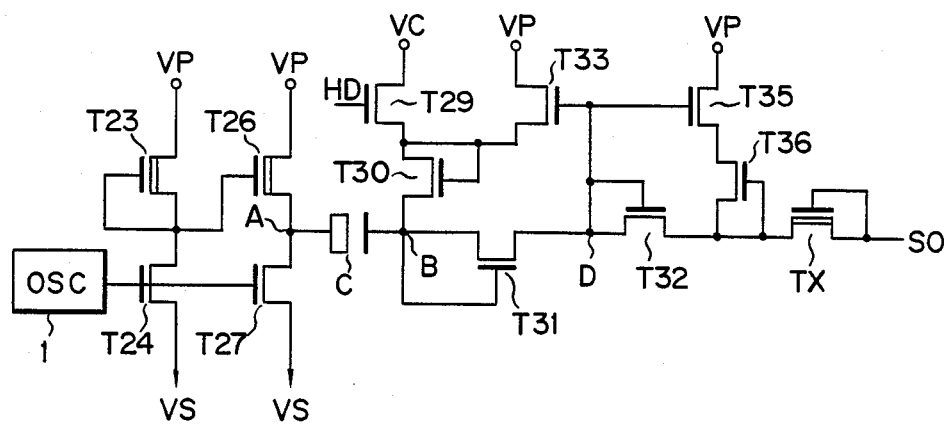
F I G. 11

NONVOLATILE SEMICONDUCTOR MEMORY DEVICE

BACKGROUND OF THE INVENTION

The present invention relates to a nonvolatile semiconductor memory device having a booster circuit.

FIGS. 1 and 2 respectively show a source voltage switching circuit and a nonvolatile memory device used in a conventional CMOS erasable and programmable (EP) ROM.

The source voltage switching circuit in FIG. 1 includes inverter INV to which write control signal W is supplied from an external circuit (not shown), p-channel MOS transistor T1 having a gate connected via n-channel MOS transistors T2 and T3 to the output terminal of inverter INV, and n-channel MOS transistor T4 connected at a gate thereof to the output terminal of inverter INV. The gates of MOS transistors T2 and T3 are respectively connected to power source voltage terminal VC and high voltage terminal Vp. MOS transistor T4 has one end connected to high-voltage terminal Vp via MOS transistor T1 and the other end connected to reference voltage terminal Vs. The connection node between MOS transistors T1 and T4 is connected to the gate of p-channel MOS transistor T5 connected between high-voltage terminal Vp and the gate of MOS transistor T1. The connection node between MOS transistors T1 and T4 is also connected to the gate of n-channel MOS transistor T6 connected between high-voltage terminal Vp and switchover power source terminal SWO. Between power source terminal Vc and switchover power source terminal SWO is connected depletion type (D-type) n-channel MOS transistor T7 whose gate is connected to receive signal $\overline{W}$. A voltage higher than that applied to power source terminal Vc is applied to high-voltage terminal Vp.

In FIG. 2, data generator DG and data driver DDR constitute data input decoder DID, whereas column selection circuit CSC and column drivers CDR1 to CDRN constitute column decoder CDC. Word line selection circuit WSC and word line drivers WDR1 to WDRM constitute row decoder RDC.

The output terminal of data driver DDR is connected to the gate of MOS transistor T8 which serves as a load transistor during data programming. The output terminals of column drivers CDR1 to CDRN are connected to the respective gates of column gate transistors T91 to T9N. The output terminals of word line drivers WDR1 to WDRM are connected to the gates of respective rows of nonvolatile MOS transistors TM11 to TMMN constituting memory cells.

Data driver DDR includes a CMOS inverter which is constituted by p- and n-channel MOS transistors DT10 and DT11 and which receives a data signal from data generator DG via n-channel transmission MOS transistor DT12 whose gate is connected to power source terminal Vc, and p-channel feedback MOS transistor DT13 connected between switchover power source terminal SWO and the input terminal of the CMOS inverter and having a gate for receiving the output signal of the CMOS inverter.

Each of column drivers CDR1 to CDRN and each of word line drivers WDR1 to WDRM are constructed in the same manner as data driver DDR. That is, MOS transistors CT10 to CT13 constituting column driver CDR1 and MOS transistors WT10 to WT13 constituting word line driver WDR1 are arranged in the same manner as MOS transistors DT10 to DT13.

During a data readout operation, the levels of signals W and $\overline{W}$ are set to "0" and "1", respectively. As a result, transistors T1 and T4 are respectively rendered nonconductive and conductive, thereby setting the gate potential of MOS transistor T6 to "0" (zero). MOS transistor T6 becomes nonconductive, whereas MMOS transistor T7 becomes conductive, whereby source voltage Vc is derived at switchover power source terminal SWO.

During data programming, signals W and $\overline{W}$ are set to "1" and "0" levels, respectively. Therefore, MOS transistor T6 becomes conductive, and MOS transistor T7 becomes nonconductive, whereby a voltage that is lower than high-voltage $V_p$ by the threshold voltage of MOS transistor T6 is generated at switchover power source terminal SWO.

During data programming, the drain voltage of memory cell transistors TM11 to TMMN is dropped by an amount corresponding to the sum of the threshold voltages of MOS transistors T6 and T8. The voltage to be applied to the drain of memory cell TMij should preferably be as high as possible within a range that does not cause a punch-through of memory cell TMij. For this reason, in the case wherein programming voltage Vp is fixed, it is not desirable that a voltage drop takes place in internal switching MOS transistors T6 and T8. Further, since the data programming characteristic depends upon the threshold voltage and conductance of memory cell TMij and switching MOS transistors T6 and T8, the disadvantage arises in that the margin of the programming voltage reduces according to variations in the manufacturing process.

SUMMARY OF THE INVENTION

The object of the invention is to provide a nonvolatile semiconductor memory device which has a large margin for a programming voltage and permits high-speed data programming.

The object is achieved by the nonvolatile semiconductor memory device which comprises: a high voltage terminal to which a high voltage is applied in a programming mode; a capacitor; a pulse signal-generator for applying a pulse signal to one end of the capacitor; a first diode connected at an anode electrode thereof to the other end of the capacitor; an output node; a second diode having an anode electrode connected to a cathode electrode of the first diode, and a cathode electrode connected to the output node; a charging circuit which is activated in the programming mode, for charging the other end o the capacitor up to a predetermined voltage level; a discharging circuit which is activated during a time other than the programming mode, for discharging the cathode electrode of the first diode down to the reference voltage level; a voltage limiter connected to the cathode electrode of the second diode, for preventing a potential at the cathode electrode from increasing above the predetermined voltage level; memory cells constituted by a plurality of nonvolatile MOS transistors; a load MOS transistor having one end connected to the high voltage terminal; a row decoder for selecting a set of memory cells which are arranged in one row; column gate MOS transistors connected at one end to respective sets of memory cells arranged in one column, and connected at the other end to the other end of the load MOS transistor; a data input decoder responsive to the voltage at the output node to energize or de-energize the load MOS transistor; and a column decoder responsive to the voltage at the output node to alternatively energize the column gate MOS transistors.

In the present invention, a booster circuit is provided in the source voltage switching circuit, so that the boosted voltage is applied to the buffer of the input decoder and column decoder. It is therefore possible to compensate for a drop in the drain voltage of the memory cell caused during a data programming operation, and thereby perform high-speed data programming.

BRIEF DESCRIPTION OF THE DRAWINGS

FIG. 3 is a diagram showing a source voltage switching circuit for a nonvolatile memory device, according to one embodiment of the invention;

FIG. 4 is a diagram showing a nonvolatile memory circuit which is driven by a source voltage generated by the source voltage switching circuit shown in FIG. 3;

FIG. 8 is a diagram showing a modified form of the booster circuit shown in FIG. 5;

FIG. 9 is a graph showing a signal waveform by way of explanation of the operation of the booster circuit shown in FIG. 8;

FIGS. 10 and 11 are diagrams showing still other modified forms of the booster circuit shown in FIG. 5.

DETAILED DESCRIPTION OF THE PREFERRED EMBODIMENTS

FIGS. 3 and 4 respectively show a source voltage switching circuit and a nonvolatile memory circuit according to one embodiment of the present invention.

The source voltage switching circuit in FIG. 3 includes ring oscillator ROS constituted by inverters IV1 to IV5, and inverter IV6 having an input terminal connected to the output terminal of ring oscillator ROS and an output terminal connected to node A via inverter IV7 and buffer BR. Inverter IV7 and buffer BR comprise n-channel MOS transistors T23 to T25 and n-channel MOS transistors T26 to T28, respectively, connected in series between high voltage terminal Vp and reference voltage terminal Vs. MOS transistors T23 and T26 are of a D-type. The gate and source of MOS transistor T23 are connected to the gate of MOS transistor T26. The gates of MOS transistors T24 and T27 are connected to the output terminal of inverter IV6. MOS transistors T25 and T28 receive at their gates boost control signal HD which is synchronous with write control signal W.

Node A is connected to node B via capacitor C. MOS transistors T29 and T30 are connected in series between power source terminal Vc and node B. Node B is connected to output terminal SO via MOS transistors T31 and T32. The gates of MOS transistors T31 and T32 are respectively connected to node B and node D between MOS transistors T31 and T32. The gate and drain of MOS transistor T30 are connected through MOS transistor T33 to high-voltage terminal Vp. MOS transistors T35 and T36 are series-connected between high-voltage terminal Vp and output terminal SO, and D-type MOS transistor T37 is connected between terminals Vc and SO. D-type MOS transistor T38 and MOS transistor T39 are series-connected between reference voltage terminal Vs and node D. Node D is connected to the gates of MOS transistors T33 and T35. The gates of MOS transistors T29 and T37 to T39 are connected to respectively receive signal HD, signal $\overline{W}$, power source voltage Vc and signal $\overline{HD}$ synchronized with signal $\overline{W}$.

Figure 2:
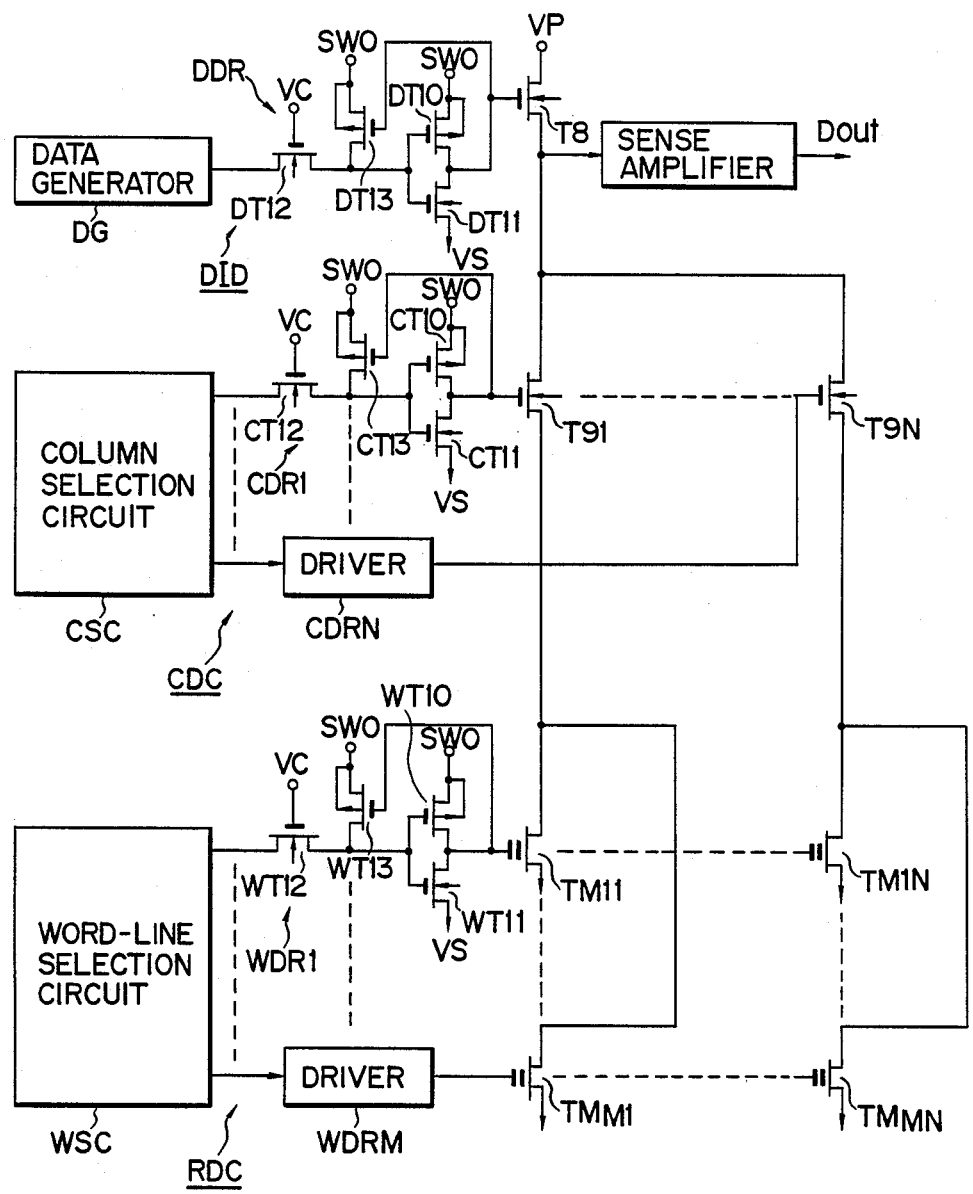
FIG. 2 is a diagram showing a conventional nonvolatile memory circuit which is driven by a source voltage generated by the source voltage switching circuit of FIG. 1.

The nonvolatile memory circuit shown in FIG. 4 is constructed and operated basically in the same manner as the circuit shown in FIG. 2, except that the circuit in FIG. 4 receives at switchover power source terminal SI the output voltage from output terminal SO of the circuit shown in FIG. 3.

The operation of the nonvolatile memory device shown in FIGS. 3 and 4 will now be described.

During an ordinary data readout operation, power source voltage Vc is applied to power source terminals Vp and Vc, and the levels of signals $\overline{W}$, HD and $\overline{HD}$ are respectively set to "1", "0" and "1". As a result, the potential at node D becomes "0" to render MOS transistors T33, T35 and T32 nonconductive, and MOS transistor T37 becomes conductive, whereby voltage Vc is generated at output terminal SO and applied to switchover power source terminals SI of the circuit shown in FIG. 4. At this time, MOS transistors T25, T28 and T29 are nonconductive, preventing current from flowing from the power source terminal to the reference voltage terminal in the switching circuit of FIG. 3.

During data programming, a voltage higher than voltage Vc (5 V, for example), e.g., 12.5 volts, is applied to high voltage terminal Vp. The levels of signals $\overline{W}$, HD and $\overline{HD}$ are set to "0", "1" and "0" respectively. Therefore, MOS transistors T25, T28 and T29 become conductive, whereas MOS transistors T37 and T39 become nonconductive. In this case, a clock signal is supplied from ring oscillator ROS to MOS transistors T24 and T27 of inverter IV7 and buffer BR, respectively, via inverter IV6. At first, node B is charged through MOS transistors T29 and T3,, and then, upon application of the clock signal from ring oscillator ROS, it is charged through MOS transistors T33 and T30, and the potential at output terminal SO increases due to the presence of MOS transistors T31 and T32 acting as a diode. The potential at terminal SO is finally stabilized when it reaches a voltage higher than high voltage Vp by an amount corresponding to the threshold voltage of MOS transistor T36. In FIG. 3 n-channel MOS transistors T30 and T31 can be replaced by intrinsic type n-channel MOS transistors MOS transistors having a threshold voltage of substantially 0 V, making it possible to shorten the time for increasing the potential at terminal SO to a preset potential level.

Switchover power source terminal SI is connected to the sources of p-channel MOS transistors DT10, DT13, CT10, CT13, WT10 and WT13. During data programming, the gates of MOS transistors T8, T9i and TMij have applied thereto a voltage higher than high voltage Vp by the threshold voltage of the n-channel MOS transistor, preventing the voltage drop in the drain voltage of the memory cell and permitting high-speed data programming.

A CMOS type EPROM employs a decoder as shown in FIG. 4. In this type, an optimum decoding operation can be achieved by changing the level of the potential at switchover power source terminal SI during data readout and write operations.

Further, in order to save power consumption during a standby condition, the levels of signals $\overline{HD}$ and HD are set to "1" and "0" respectively, in the same manner as in the case of the data readout operation, so that MOS transistor T39 becomes conductive. As a result, the gate voltage of MOS transistor T35 is set to "0", whereby a leak current flowing through MOS transistors T37 and T36 from power source Vc is suppressed even when the voltage at high-voltage terminal Vp is set at "0".

Figure 5:
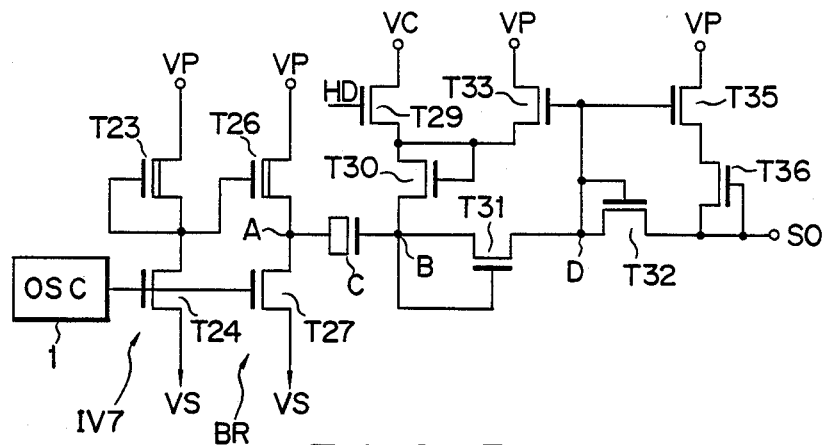
FIG. 5 is a circuit diagram showing a booster circuit section in the source voltage switching circuit of FIG. 3.

FIG. 5 shows a circuit section corresponding to part of the circuit shown in FIG. 3, by way of explanation of the boost operation performed in the circuit. In FIG. 5, the same reference symbols as used hereinbefore refer to corresponding parts or elements, and the description thereof is omitted.

Figure 6:
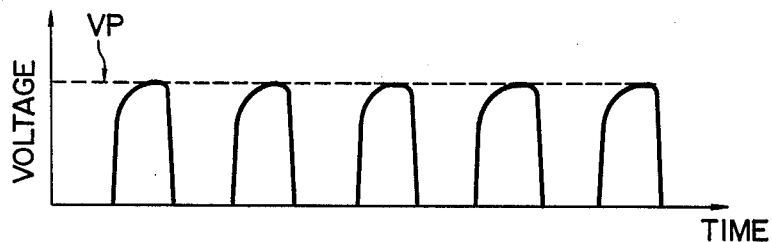
FIGS. 6 and 7 are graphs showing signal waveforms by way of explanation of the operation of the booster circuit shown in FIG. 5.

In FIG. 5, oscillator 1 includes ring oscillator ROS and inverter IV6 shown in FIG. 3. In response to a clock signal supplied from oscillator 1, a signal containing pulse components as shown in FIG. 6 is generated at node A.

When the level of boost control signal HD is set at "1", MOS transistor T29 becomes conductive, thereby charging node via MOS transistor T30. The potential at node B becomes lower than source voltage Vc by the threshold voltages (Vth) of MOS transistors T29 and T30. At the same time, the OSC circuit starts to operate, and when the level of the clock signal changes from "H" to "L" level, node A is rapidly charged up to high voltage Vp through MOS transistor T26. In response to a voltage increase from "0" to Vp at node A, the potential at node B is also boosted due to the capacitive coupling. For example, the voltage at node B which has been charged at source voltage Vc level is boosted by about 4 volts (i.e., to approximately 9 volts), in response to a level change from "H" to "L" of the clock signal from oscillator 1. When a clock signal from oscillator 1 becomes "H" level, the potential at node "A" becomes "0", lowering the potential at node "B". However, since node D is connected to node B via diode-connected MOS transistor T31, the potential does not decrease and the potential at node B is applied to the gate of MOS transistor T33, thereby making transistor T33 conductive. Thus, a voltage lower than a voltage on node D by the threshold voltage of MOS transistor T33 is applied to MOS transistor T30, and node B is charged to a level higher than power source voltage Vc. When, thereafter, the level of the clock signal from oscillator 1 becomes "L", node B is further boosted. Node B is charged up to source voltage Vc−2×threshold voltage of n-channel MOS transistor MOS transistor T29. However, after the voltage at node B exceeds (power source voltage Vc−2×threshold voltage of n-channel MOS transistor) node B is boosted by MOS transistor T33 since MOS transistor T29 is the nonconductive.

Figure 7:
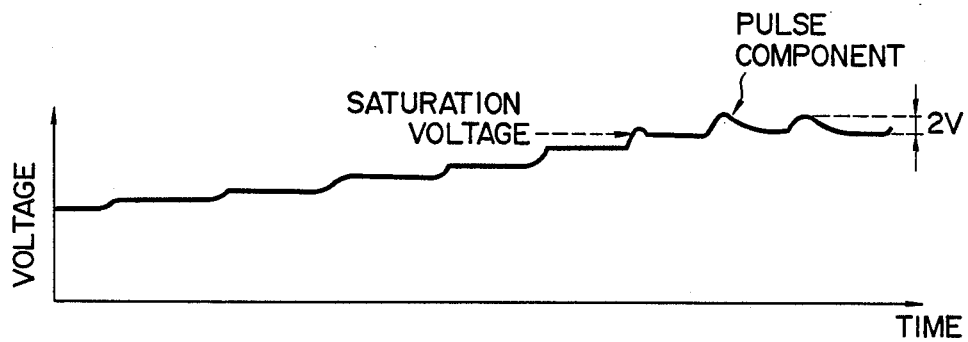

The voltage at node D, boosted as above, is applied to output terminal SO through MOS transistor T32. The maximum output voltage that is applied to output terminal SO is determined by a limiter constituted by MOS transistors T35 and T36. That is, when the output voltage becomes higher than high voltage Vp by an amount larger than threshold voltages VthB of MOS transistor T36 which is set responsive to the substrate bias effect, a current flows through MOS transistors T35 and T36 to terminal Vp, thereby dropping the output voltage. Therefore, the output voltage is approximately equal to the sum of high voltage Vp and threshold voltages VthB of MOS transistor T36, which is set responsive to the substrate bias effect, i.e., approximately equal to the saturation voltage. If, in this case, the voltage at node A increases while a discharge occurs through MOS transistors T30 and T33 the voltage at node B is also temporarily increased, whereby the pulse components of approximately 2 V as shown, for example, in FIG. 7 are contained in the output voltage. If the output voltage containing such pulse components is applied to switchover power source terminal SI of the memory circuit shown in FIG. 4, the following problems will be caused.

If the output voltage SO contains pulse components, the voltages at, for example, the P-type drain regions of MOS transistors DT10 and DT13 of data driver DDR will increase more quickly than the N-well regions. As a result, a current flows from the drain region to the N-well region, possibly causing a latch-up.

When an output signal from data generator DG in data driver DDR is at "0" level, an "H"-level signal is fed back to the gate of MOS transistor DT13, and MOS transistor DT13 becomes nonconductive, and accordingly, no current flows through MOS transistor DT13. However, when the pulse component contained in output voltage SO is applied to switchover power source terminal SI, voltage SI is applied to the gate of MOS transistor DT13 through MOS transistor DT10. After a certain delay time, the pulse component is applied to the same transistor. Therefore, while the gate potential of MOS transistor DT13 is kept lower than the source potential thereof by an amount equal to threshold voltage Vth of MOS transistor DT13, MOS transistor DT13 is kept conductive. A current therefore flows through MOS transistor DT13, causing switchover voltage SI, which has been boosted, to be lowered.

FIG. 8 shows a booster circuit that is free of the disadvantages described above. This booster circuit has a structure similar to that shown in FIG. 5, except that capacitor CX is connected between reference voltage terminal Vs and the connection node between MOS transistors T23 and T24. Capacitor CX comprises, for example, a MOS transistor having a gate connected to the connection node between MOS transistors T23 and T24 and a source and drain connected to reference voltage terminal Vs.

Capacitor CX serves to make moderate or gentle changes in potential of the output pulse of inverter IV7. Thus, changes of current flow from the drain to the source of MOS transistor T26 and the rate of charging at node A becomes moderate. When the potential at node A is applied via capacitor C to node B and further to switchover power source terminal SO via MOS transistors T31 and T32, the potential changes at nodes B and D become moderate, and the potential at switchover power source terminal SO does not increase above the sum of high voltage Vp and the threshold voltage of MOS transistor T36, since the charging rate at node A is moderate. In this case, switchover power source voltage SO does not contain pulse components, a shown in FIG. 9.

FIG. 10 shows another booster circuit in which changes in potential at node B are made moderate or gentle in order to eliminate the afore-described disadvantages. This booster circuit has a structure similar to that shown in FIG. 5, except that a polysilicon resistor RX is provided between node A and capacitor C. In this booster circuit, the potential at node A increases rapidly. However, since the potential at node A is applied via resistor RX and capacitor C to node B, the potential at node B changes moderately. As a result, switchover power source voltage SO does not contain pulse components in the same manner as shown in FIG. 9.

The booster circuit shown in FIG. 11 is similar to that shown in FIG. 5 but additionally includes D-type MOS transistor TX. MOS transistor TX is connected at its drain to the source of MOS transistor T32 and connected at its gate and source to output terminal SO. That is, MOS transistor TX is diode-connected between MOS transistor T32 and output terminal SO, so that rapid changes in potential at the source of MOS transistor T32 can be made moderate or gentle. The potential thus obtained is applied to output terminal SO. The output voltage does not contain pulse components, as in the case shown in FIG. 9.

Figure 1:
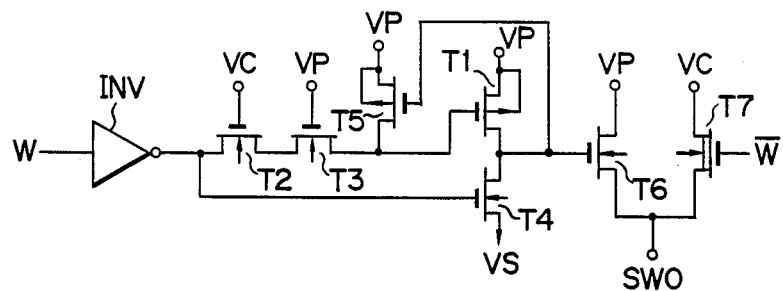
FIG. 1 is a diagram showing a conventional source voltage switching circuit.

It should be noted that the present invention is not limited to the embodiment described above. For example, the gate of N channel MOS transistor DT11 can be separated from MOS transistor DT12 and directly connected to the output terminal of data generator DG. This can enlarge the operational margin for fluctuation in the power source voltage. Further, in the memory circuit shown in FIG. 4, output voltage SO of the source voltage switching circuit in FIG. 3 is applied to each of word line drivers WDR1 to WDRM. Alternatively, the output voltage of a conventional source voltage switching circuit, as shown in FIG. 1, may be applied to each of the word lines. In this case, MOS transistor T6 can be of a depletion type. With the depletion MOS transistor, a high voltage Vp is derived form switchover power source terminal SWO at the programming time.

Further, the power source voltage switching circuit shown in FIG. 3 may contain more than one MOS transistor T36 diode-connected between high voltage terminal Vp and switchover power source terminal SO constituting a limiter.

What is claimed is:

1. A nonvolatile semiconductor memory device comprising:
    a first power source line for supplying a high voltage in a data read operation and a data write operation;
    a second power source line for supplying a low voltage in said read and write operations;
    a third power source line for supplying a write voltage in said write operation;
    a plurality of row lines;
    a plurality of column lines;
    a memory cell array comprising a plurality of nonvolatile transistors, each having a gate, a drain, and a source, each of said gates being connected to a corresponding one of said row lines, each of said drains being connected to a corresponding one of said column lines, and each of said sources being connected to said second power source line;
    a write switch transistor for applying said write voltage to said memory cell array, said write switch transistor having a source, a drain, and a gate, and said drain of said write switch transistor being connected to said third power source line;
    a plurality of column gate transistors each having a gate, a drain, add a source, each of said sources of said column gate transistors being connected to a corresponding one of said column lines, and each of said drains of said column gate transistors being connected to said source of said write switch transistor;
    voltage boosting means for generating a boosted voltage during said write operation, a potential of said boosted voltage being higher than that of said write voltage;
    a boost line connected to said voltage boosting means, said boost line being supplied with said boosted voltage during said write operation;
    data input means for switching said write switch transistor in response to an input data applied to said data input means during said write operation, said data input means including:
    an input portion to which said input data is applied and an output portion connected to said gate of said write switch transistor, said output portion including:
        a first F-channel MOS transistor and a second N-channel MOS transistor, a source of said first transistor being connected to said boost line, a drain of said first transistor being connected to said gate of said write switch transistor and a drain of said second transistor, a source of said second transistor being connected to said second power source line, and gates of said first and second transistors being connected to said input portion, respectively; and
    column decoding means for selectively applying said boosted voltage in said write operation, including:
    a column selection circuit and a column driving circuit, said column driving circuit having a third P-channel MOS transistor having a source, a drain, and a gate, and a fourth N-channel MOS transistor having a source, a drain, and a gate, said source of said third transistor being connected to said boost line, said drain of said third transistor being connected to said drain of said fourth transistor, said source of said fourth transistor being connected to said second power source line, said gates of said third and fourth transistors being connected to said gate of a predetermined one of said column gate transistors.

2. A nonvolatile semiconductor memory device according to claim 1, wherein said output portion of said data input means further includes a fifth P-channel MOS transistor having a source, a drain, and a gate, and a sixth N-channel MOS transistor having a source, a drain, and a gate, said source of said fifth transistor being connected to said boost line, said drain of said fifth transistor being connected to said gate of said first transistor, said gate of said fifth transistor being connected to said drain of said first transistor, said gate of said first transistor being connected to said input portion through a drain source current path of said sixth transistor.

3. A nonvolatile semiconductor memory device according to claim 2, wherein said column driving circuit of said column decoding means further includes a seventh F-channel MOS transistor having a source, a drain, and a gate, and an eighth N-channel MOS transistor having a source, a drain, and a gate, said source of said seventh transistor being connected to said boost line, said drain of said seventh transistor being connected to said gate of said third transistor, said gate of said seventh transistor being connected to said drain of said third transistor, said gate of said third transistor being connected to said column selection circuit through a drain source current path of said eighth transistor.

4. A nonvolatile semiconductor memory device according to claim 3, wherein said gate of said second transistor is connected to said input portion through said drain source current path of said sixth transistor, and said gate of said fourth transistor is connected to said column selection circuit through said drain source current path of said eighth transistor.

5. A nonvolatile semiconductor memory device according to claim 3, wherein said gate of said second transistor is connected to said input portion directly, and said gate of said fourth transistor is connected to said column selection circuit directly.

6. A nonvolatile semiconductor memory device according to claim 1, further including row decoding means for selectively applying said boosted voltage in said write operation, said row decoding means including a row selection circuit and a row driving circuit, said row driving circuit having a ninth P-channel MOS transistor having a source, a drain, and a gate, and a tenth N-channel MOS transistor having a source, a drain, and a gate, said source of said ninth transistor being connected to said boost line, said drain of said ninth transistor being connected to a drain of said tenth transistor, said source of said tenth transistor being connected to said second power source line, gates of said ninth and tenth transistors connected to said row selection circuit respectively and a connecting point of said ninth and tenth transistors being connected to one of said row lines.

7. A nonvolatile semiconductor memory device according to claim 1, wherein said voltage boosting means includes:
   capacitive means having first and second ends;
   pulse signal generating means for applying a pulse signal to the first end of said capacitive means;
   first diode means having an anode and a cathode, said anode of said first diode means being connected to the second end of said capacitive means;
   second diode means having an anode and a cathode, said anode of said second diode means being connected to said cathode of said first diode means, said cathode of said second diode means being connected to said boost line;
   a charging circuit for charging said second end of said capacitive means during said write operation; and
   a discharging circuit for discharging said cathode of said first diode means to a potential of said low voltage during said read operation.

8. A nonvolatile semiconductor memory device according to claim 7, wherein said voltage boosting means further includes:
   voltage limiting means for clamping said boosted voltage to a predetermined voltage said voltage limiting means having a current path connected between said cathode of said second diode means and said third power source line; and
   a power switch transistor having a drain and a source, said drain of said power switch transistor being connected to said first power source line, said source of said power switch transistor being connected to said cathode of said second diode means, said power switch transistor being activated during said read operation.

9. A nonvolatile semiconductor memory device according to claim 8, wherein said voltage limiting means includes at least one diode having an anode and a cathode, said anode of said at least one diode being connected to said cathode of said second diode means, said cathode of said at least one diode being connected to said third power source line.

10. A nonvolatile semiconductor memory device according to claim 9, wherein said voltage limiting means further includes a first switch transistor having a drain source current path and a gate, said drain source current path of said first switch transistor being connected in series between said cathode of said at least one diode and said third power source line, said gate of said first switch transistor being connected to said cathode of said first diode means.

11. A nonvolatile semiconductor memory device according to claim 7, wherein said charging circuit includes a first charging transistor, second charging transistor and third diode means, a cathode of said third diode means being connected to said second end of said capacitive means, said first and second charging transistors each having a source, a drain, and a gate, said sources of said first and said second charging transistors being connected to an anode of said third diode means, said drains of said first and said second charging transistors being connected to said first and said third power source lines, respectively, said gate of said second charging transistor being connected to said cathode of said first diode means.

12. A nonvolatile semiconductor memory device according to claim 11, wherein said third diode means is an N-channel MOS transistor having a threshold voltage of substantially 0 V.

13. A nonvolatile semiconductor memory device according to claim 7, wherein said pulse signal generating means includes:
   an oscillating circuit for generating a low level pulse signal; and
   an inverting means for applying a high level pulse signal to said first end of said capacitive means in response to said low level pulse signal.

14. A nonvolatile semiconductor memory device according to claim 13, wherein said inverting means includes a first load transistor, a second load transistor, a first driving transistor and a second driving transistor, each of said load transistors and driving transistors having a source, a drain, and a gate, said drains of said first and second load transistors being connected to said third power source line, said source of said first load transistor being connected to said first and of said capacitive means and said drain of said first driving transistor, said sources of said first and second driving transistors being connected to said second power source line, said source of said second load transistor being connected to said gates of said first and said second load transistors, said drain of said second driving transistor being connected to said source of said second load transistor, said first and second driving transistors receiving said low level pulse signal at said gates thereof.

15. A nonvolatile semiconductor memory device according to claim 14, wherein said inverting means further includes a capacitor connected between said gate of said first load transistor and said second power source line.

16. A nonvolatile semiconductor memory device according to claim 14, wherein said inverting means further includes a resistor connected between said first end of said capacitive means and said second source of said first load transistor.

17. A nonvolatile semiconductor memory device according to claim 7, further including a depletion type N-channel MOS transistor having a drain source current path and a gate, said drain source current path of said depletion type transistor being connected between said cathode of said second diode means and said boost line, said gate of said depletion type transistor being connected to said boost line.

18. A nonvolatile semiconductor memory device according to claim 1, wherein said first diode means is an N-channel MOS transistor having a threshold voltage of substantially 0 V.

* * * * *